United States Patent [19]

Goehler et al.

[11] 4,064,462

[45] Dec. 20, 1977

[54] ACOUSTIC FEEDBACK PEAK ELIMINATION UNIT

[75] Inventors: Rolf J. Goehler, Schaumburg; Charles W. King, Saint Charles, both of Ill.

[73] Assignee: Dukane Corporation, St. Charles, Ill.

[21] Appl. No.: 755,518

[22] Filed: Dec. 29, 1976

[51] Int. Cl.[2] .............................................. H03F 1/34

[52] U.S. Cl. .................................... 330/2; 179/1 FS; 179/1 P; 330/109; 330/126; 330/151; 331/59

[58] Field of Search .................. 330/2, 107, 109, 126, 330/151, 149; 328/167; 179/1 AT, 1 D, 1 FS, 1 P; 331/59

[56] References Cited

U.S. PATENT DOCUMENTS

| | | | |
|---|---|---|---|
| 3,530,394 | 9/1970 | Deloach | 330/151 X |
| 3,750,044 | 7/1973 | Stanley | 330/126 |
| 3,755,749 | 8/1973 | Van Ryswyk et al. | 328/167 |
| 3,818,149 | 6/1974 | Stearns et al. | 179/1 D |
| 4,001,732 | 1/1977 | Gundry | 331/59 X |

FOREIGN PATENT DOCUMENTS

| | | | |
|---|---|---|---|
| 2,253,861 | 5/1974 | Germany | 328/167 |

OTHER PUBLICATIONS

"Controlled Active RC Filter Circuitry gives Lab. Unit Wide Applications," *Electronic Design* 3, Feb. 1, 1967, pp. 110,112.

*Primary Examiner*—James B. Mullins
*Attorney, Agent, or Firm*—Robert L. Kahn

[57] ABSTRACT

This invention is an acoustic feedback peak elimination unit and has as its objective the elimination of unwanted acoustic resonance peaks, also called ring modes, inherent in an enclosed region where a sound amplifying system may be used. A number of separate units embodying the present invention may be used in cascade, each unit being adapted to handle a small frequency range of about an octave within the entire frequency range to be amplified, each such unit functioning at unity gain to eliminate a single feedback peak when present. In addition, the invention includes means for energizing an oscillator within its tunable frequency range so that a particular frequency may be introduced for tuning the entire sound system with desired precision.

6 Claims, 2 Drawing Figures

ACOUSTIC FEEDBACK PEAK ELIMINATION UNIT

INTRODUCTION

This invention relates to an acoustic feedback peak elimination unit particularly used in sound amplifier systems for enclosed areas and meeting places such as theatres, halls, and similar indoor locations where an audience is usually present to listen to a speaker, musician, or group of performers provide speech or music or both for the listening or entertainment of such audience. The invention more specifically relates to the audio sound system whereby the performer, speaker or group generate or provide speech or music into a sound system to be amplified and listened to by an audience through the medium of a sound reinforcement system having any desired number of loud speakers. In an environment of the above character, there are generally present one or more ring modes usually in the lower range of the frequency range to be handled. Thus, as an example, the entire spectrum of speech or music frequencies will range over the entire audio frequency range, depending upon the quality of reproduction to be desired. Generally, ring modes, one or more, will be present in such an auditorium, such ring modes usually being located within the lower frequency range up to about 4 or 5 KHz. The amplitude and number of such ring modes will vary depending upon such factors as nature of sound reflecting walls and surfaces, and the gain characteristics of the amplifying system. In addition, the number of auditors within the auditorium is important and also the nature of the furnishings within the auditorium, such as, for example, the number and character of seats, if any, whether or not the auditors are quiet and motionless for the most part, or whether, as on a dance floor, for example, or a public meeting, there is considerable movement of people, and in all cases to some extent, on temperature and humidity.

In such a sound system, it is important that a suitable, controllable gain for the sound energy over the entire frequency range to be handled be provided. This necessarily involves the suppression or elimination of room ring modes. Such an objective is not inconsistent with the generally desirable objective of controlling the gain of the amplification system so that certain portions of the audio spectrum being handled may be emphasized, such as, for example, low frequencies and/or high frequencies.

Inasmuch as different environments, different enclosures, even different levels of gain create different conditions of feedback, it is essential that a sound system be adaptable and adjustable to provide desired, relatively high, gain characteristics without annoying acoustic feedback under typical conditions of use.

THE INVENTION GENERALLY

A unit embodying the present invention is adapted to be included as one or more functional components operating at unity gain between the output of one or more sound energy-receiving transducers usually feeding a low level line amplifier and a power amplifier, the latter feeding one or more speakers. Units embodying the present invention include means for determining at a desired gain the amplitude and location in the frequency spectrum of one or more inherent ring modes in the acoustic characteristics of an auditorium and also include means for sampling such inherent ring modes (one unit operating over a limited portion of the frequency spectrum) and injecting a counteracting amplitude response characteristic in such acoustic spectrum at this frequency for substantially eliminating the effects of such inherent ring mode in the overall operation of the amplifying system.

In the event that more than one inherent ring mode is to be handled, then individual units operating at unity gain embodying the present invention are successively cascaded in the communication channel in the entire sound system. Thus, the overall effect is the elimination of ring modes in the sound reinforcement system at a desired overall gain level. A unit embodying the present invention includes means for controlling the amplitude of sound reinforcement for counteraction. Thus, a sound system having or including one or more units embodying the present invention can provide means for a complete determination of the location of ring modes along the frequency spectrum at various amplifier gain levels and also means for equalizing the overall amplifier gain characteristics in the region of the unwanted feedback frequencies.

In practice, a physical unit embodying the present invention can consist substantially of a relatively small printed circuit card covering a small portion of the frequency spectrum to be handled. A set of cards containing printed circuits, each such card covering a different small frequency portion, may be provided to cover a continuous larger desired portion of the entire frequency spectrum to be handled. In practice, the range covered by such cards may extend up to about 4 or 5 KHz, although it will be understood that in some circumstances or application of the invention, higher portions of the frequency range may be handled by suitable additional cards. As a rule, the extent of frequency range portion covered by any one card will increase as the frequency increases. Thus as an example, cards can be readily made to operate or tune through about one octave or more. Thus one card may cover 63 to 125 Hz, other cards go higher until, say, a 2 KHz card can extend to 4 KHz. The invention may be applied to ultra-sonic and subsonic frequencies.

DESCRIPTION OF THE DRAWING

For a complete understanding of the invention, reference will now be made to the drawing wherein.

GENERAL CHARACTERISTICS OF A UNIT EMBODYING THE PRESENT INVENTION

In general, a single frequency feedback elimination unit embodying the present invention may utilize two or three separate but similar plug-in operational amplifiers (op-amp) generally having similar operating characteristics. The amplifying means per se may utilize discrete circuit elements which, for convenience, are conventionally shown in distinct combined form as triangles in the figures. However, for reasons of cost and availability, it is preferred to rely upon integrated circuit chips as indicated diagrammatically, and being of a type known as operational amplifiers, simply designated as "op-amps". Op-amps of the type used herein have two signal input ports and one output port. Signal frequencies feeding one input port will appear inverted in phase at the output port, and this one input port is designated for convenience with a minus (−) sign. The other input port is marked plus (+), meaning that the signal may be amplified through that portion of the op-amp without phase reversal at the output port.

The narrow pass band amplifying system embodying the present invention is preferably but not necessarily designed to have a Q in the range from about 25 to about 45 or 50, and more specifically, about 30. The frequency range between half power points on a resonant or ring mode peak will generally be in the order of about 3 Hz at the lower end of a frequency spectrum (63 to 125 Hz) and may vary up to about 94 Hz in the upper portions of the spectrum of frequencies at about 4 KHz. Such Q values and bandwidths between half power points will generally be practical for actual tunable use, considering the fact that the feedback characteristics of an auditorium can vary.

Figure 2:
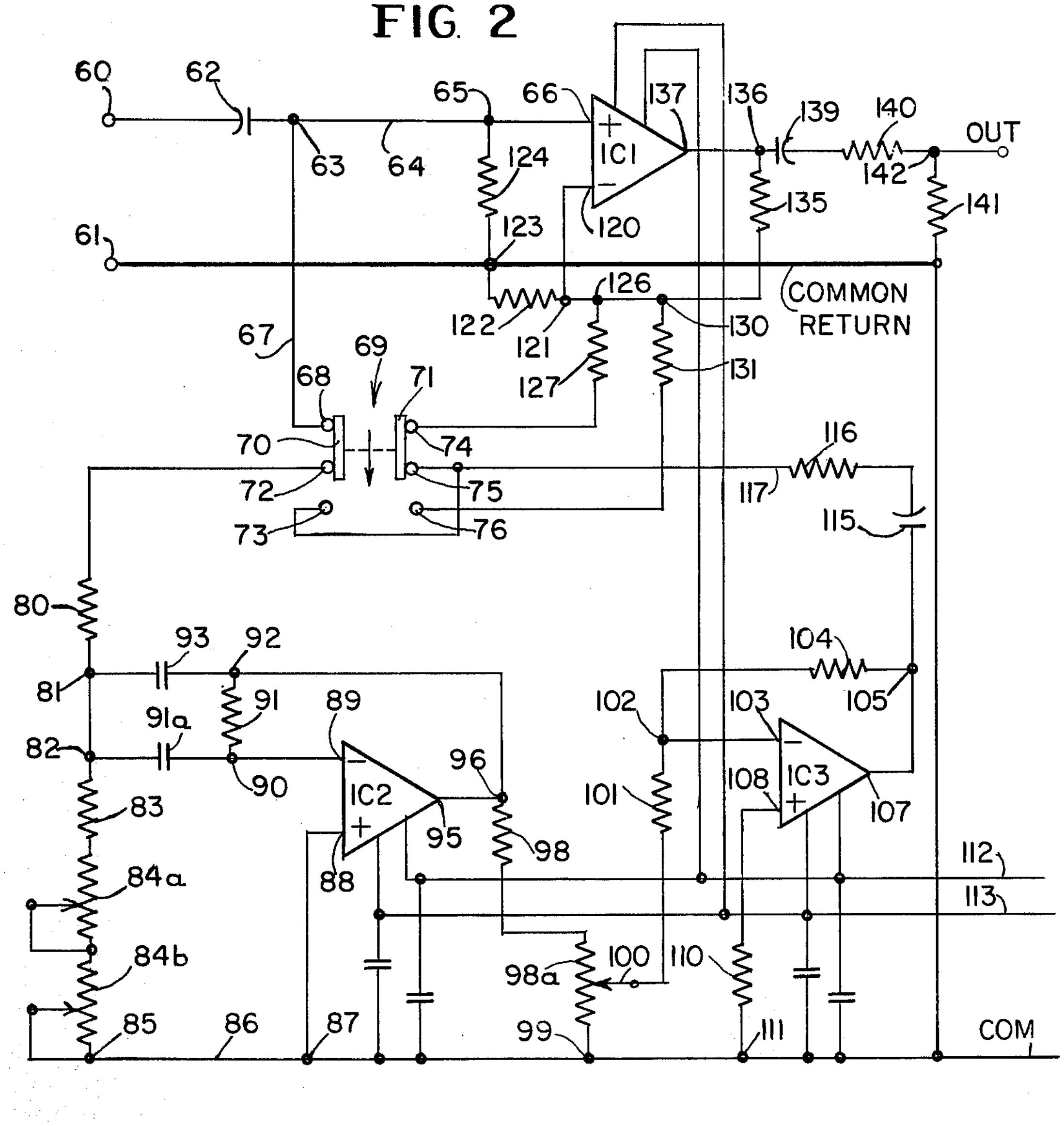
FIG. 2 is a schematic showing a practical unit embodying the present invention.

Each unit embodying the present invention and more fully described and illustrated in FIG. 2 of the drawing is preferably mounted on a printed circuit card provided with plug-in type of connectors. It is understood that the length and distribution of wire leads from the printed circuitry to the plug-in pins are as short as possible and are not subject to significant electrostatic coupling therebetween. In an exemplary embodiment of the invention, a Motorola-type of operational amplifier No. MC1741SCP was used for each of the amplifiers illustrated. For a complete consideration of Operational Amplifiers, reference is made to *Applications Of Operational Amplifiers — Third Generation Techniques* by J. G. Graeme, published 1973 by McGraw-Hill Book Co., New York City.

Figure 1:
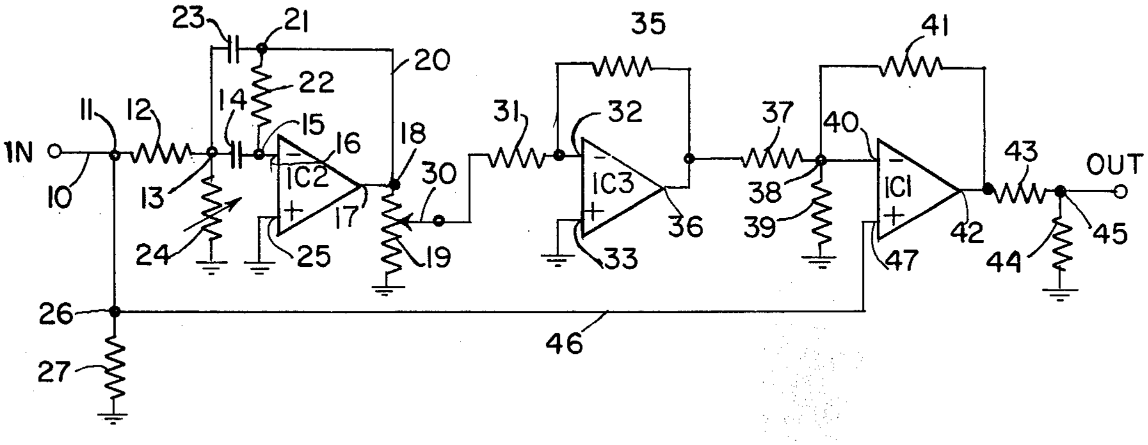
FIG. 1 is a functional diagram illustrating the basic components of a system embodying the present invention for handling an inherent ring mode and counteracting the same.

Referring first to FIG. 1, this shows a portion of the complete system of FIG. 2, indicating only the signal paths through a typical acoustic feedback elimination unit utilizing this invention. Omitted in FIG. 1 are the isolating capacitors, common return paths, direct current power sources, connections for circuit oscillation, and the like. Thus, while FIG. 1 is more than a block diagram, it does not purport to be a complete schematic of the invention. Its use in this description is to simplify describing the operation of the acoustic feedback elimination system shown more fully in FIG. 2.

A communication channel 10 carries electric sound frequency signals over a range of from between 40 to 15,000 Hz (or more as desired) at normal line level amplitude to junction 11. It is understood that channel 10 includes a common return conductor and that such signals are provided by the output of relatively low level amplifiers which operate upon the output of microphones, record players, mixers, etc. From junction 11, the circuit continues through resistor 12, junction 13, capacitor 14, junction 15 to inverting port 16 of first stage op-amp IC2. Op-amp IC2 has output port 17 connection to junction 18. Junction 18 is connected to common returned potentiometer resistor 19 (or equivalent other signal attenuator) and is also connected by conductor 20 to junction 21, the latter being connected through resistor 22 to junction 15. For convenience, the common return (com-return) is indicated by a ground symbol. In present day practice, an actual ground may be provided through a power supply connection. Junction 21 is also connected through capacitor 23 back to junction 13, which junction is connected through variable resistor 24 to com-return. The non-invert input port 25 is also com-returned. Junction 11 is connected to junction 26 at com-returned resistor 27. Variable resistor 24 shifts the center frequency of the narrow pass band filter network while resistor (attenuator) 19 provides amplitude control.

Resistor 19 and wiper 30 function as a variable attenuator whose output is at 30. Potentiometer wiper 30 is connected through resistor 31 to inverting input port 32 of op-amp IC3; its non-invert input port 33 being com-returned. Inverting input port 32 is coupled by resistor 35 to output port 36 of IC3. Output port 36 also is connected through resistor 37 to junction 38, the latter being com-returned through resistor 39 and also connected to inverting input port 40 of op-amp IC1. Junction 38 is also connected through resistor 41 to output port 42 of IC1. Output port 42 is connected through output resistors 43 and 44, the latter being com-returned. Junction 45 between resistors 43 and 44 is an output terminal. Conductor 46 runs between junction 26 and non-inverting input port 47 of IC1 and conducts the broad input frequency spectrum signals.

Op-amp IC2 and its various networks connected thereto function as an infinite gain, multiple feedback narrow band pass filter means. The IC3 stage buffers and inverts while the IC1 stage functions as a differential amplifier utilizing its common mode rejection feature.

The operation of the system illustrated in FIG. 1 is generally as follows. Three basic stages are involved in this invention; a very narrow bandpass active filter, a phase inverter, and a differential amplifier of the common mode rejection type.

The filter passband characteristics of op-amp IC2 are determined by the network consisting of capacitors 14 and 23 and resistors 24, 22, and 12. Resistor 24 preferably is variable and is used for establishing the center-frequency of the passband. Attenuator 19 is used for adjusting the amplitude of the filtered signal fed to the buffer-inverter stage.

Identical op-amplifiers are used for convenience. When a complete sound amplifying installation, including this feedback rejection unit, is initially activated, as the overall gain control is gradually advanced to increase loudness, a setting will usually be reached where an undesirable acoustic howl develops at some single audible frequency. This single audible signal will appear as a voltage in channel 10, at junctions 11 and 26, and will follow conductor 46 to the non-inverting input port 47 of op-amp IC1, appearing at output port 42. Now, for example, if this feedback frequency happens to fall outside the narrow passband of the filter stage, no signal would be fed to the buffer-inverter stage input port 32 of op-amp IC3. Likewise, none would appear at input port 40 of differential op-amp IC1. By design, op-amp IC1 would then simply continue to amplify this fedback ring frequency, the signal continuing to appear at output port 42, at terminal junction 45, and be further amplified by the subsequent power amplifiers, not shown. The howl has not been eliminated in this instance.

Assuming that the narrow passband stage is now tuned precisely to the feedback frequency appearing at junction 11 by the variable resistor 24, then the signal would pass into input port 16, through op-amp IC2, at output port 17, being 180° out of phase. This inverted signal, suitably adjusted to a desirable level by attenuator 19, would appear at wiper 30, flow through resistor 31 to inverting port 32 of op-amp IC3 and become re-inverted at output port 36, continuing through resistor 37 to inverting input port 40 of op-amp IC1. Note that the signal frequency (feedback howl) appearing at port 40 has the same phase with what it originally was in channel 10, also at junctions 11, 13, 15, 26, and input ports 16 and 47. As is described fully in the previously named book by J. G. Graeme, op-amp IC1 is connected to function as a common mode, rejection type differential amplifier. Its properties are such that by judicious selection of resistor values, signals of the same frequency, of proper amplitudes and of identical phase, when fed independently to each of the two input ports (40 and 47) will be internally processed by op-amp IC1 to yield virtually zero signal at output port 42. Actually, attenuator 19 can be used to reduce the feedback signal at port 42 to any suitable level. Thus, by the combination of elements in FIG. 1, with adjustment of resistor 24 and attenuator 19, it is possible to destroy one acoustic feedback loop in a total sound reinforcement system and to eliminate that particular howl frequency encountered at the originally selected operating level.

The procedure permits the overall sound system gain level to be further increased until a second feedback howl frequency is encountered. Another cascaded peak elimination unit as just described may be used after the output of the first unit, and likewise for any desired additional ring modes as needed. The overall amplification characteristics of each individual unit are tailored to provide unity gain outside the passband specifically tuned to eliminate that one unwanted frequency. This allows a practical number of cascaded units to be used, as 10 or more, without upsetting the desired overall fidelity of the entire amplifying system.

DESCRIPTION OF SPECIFIC FIG. 2 UNIT

Referring now to FIG. 2, the specific embodiment of the invention more generally described in connection with FIG. 1 is complemented by means to provide additional advantages whereby operational amplifiers IC2 and IC3 and the networks going into and out of the feedback elimination unit can be arranged to temporarily establish an oscillator function to create the identical frequency to be suppressed to be injected into the signal channel port 38 (FIG. 1) in connection with testing procedure when no separate test oscillator is available. By virtue of this arrangement, to be described in connection with FIG. 2, the frequency to be suppressed may be introduced into the entire sound amplifier system for test purposes. It should be understood that the system generally disclosed in connection with FIG. 1 and more specifically illustrated in FIG. 2 and to be described is a narrow band pass filter covering a certain range of frequencies and provided with means for suppressing a feedback frequency within the band by introducing an in-phase signal frequency to an independent input port of a differential amplifier to neutralize the room resonance peak appearing at its other input port.

The entire system illustrated in FIG. 2 is normally inserted in a complete communication system extending between one or more sources of sound signals (such as microphones and the like where each transducer may have its own individual low level line amplifier and feeds into a mixer for combining sound currents from individual sources) to what might be termed an active filter unit illustrated in FIG. 2, the output of which is fed into a power amplifier whose output in turn goes to one or more loud speakers arranged in any desired fashion. One or more units of the system illustrated in FIG. 2 and described herein may be connected (or cascaded) between a mixer (if more than one sound transducer is used, or a simple line amplifier if only one sound transducer is used) and a conventional power amplifier whose output in turn goes to a speaker system. The input terminals for the system illustrated in FIG. 2 are 60 and 61, the latter being com-returned. Terminal 60 is connected to one side of capacitor 62 which has a great enough value to pass freely frequencies within the operating range of the channel, as an example, 100 microfarads ($\mu$F). The remaining terminal of capacitor 62 goes to junction 63.

From junction 63, conductor 64 goes through junction 65 to non-invert input port 66 of op-amp IC1. From junction 63, conductor 67 goes to terminal 68 of a switch 69 having mechanically coupled movable contacts 70 and 71 cooperating with switch contacts 68, 72 to 76 inclusive. Switch contact 72 is connected to resistor 80 whose other terminal is connected to junction 81. Junction 81 is connected to junction 82 which is connected through resistor 83 and variable resistors **84*a* and 84*b* in series to junction 85. These two variable resistors are in series and their values are related to each other so that resistor 84*a* provides a coarse adjustment and resistor 84*b* provides a fine adjustment for the purpose of tuning the filter's center frequency. Junction 85 is connected by conductor 86 to junction 87 which in turn is connected to non-inverting input port 88 of op-amp IC2. Inverting input port 89 of op-amp IC2 is connected back to junction 90 which in turn is connected through resistor 91 to junction 92. Junction 92 is connected through capacitor 93 to junction 81 while junction 90 is connected through capacitor 91*a* to junction 82**.

Op-amp IC2 has its output terminal 95 connected to junction 96 which has a connection up to junction 92 and is also connected through series connected resistor 98 and potentiometer **98*a* to junction 99 on conductor 86. Cooperating with potentiometer 98*a* is potentiometer wiper 100 connected through resistor 101 to junction 102. The latter junction is connected to inverting input port 103 of op-amp IC3 and is also connected from junction 102 through resistor 104 to junction 105 which is connected to output port 107 of op-amp IC3. Non-inverting input port 108 of amplifier IC3 is connected back through resistor 110 to junction 111 on conductor 86. Conductors 112 and 113 are respectively the plus and minus power supply connections and are shown as being connected to appropriate terminals on the op-amps IC1, IC2, and IC3. Power supply conductors 112 and 113 respectively are coupled by several capacitors to common return conductor 86 for the purpose of by-passing any ripples in the power supply circuit. Junction 105 is connected to coupling capacitor 115, whose other lead goes to one terminal of resistor 116, the other terminal of which is connected by conductor 117 to terminal 75 of switch 69. Switch contacts 73 and 75** are connected together.

Referring to op-amp IC1, inverting input port 120 of this amplifier is connected to junction 121 which in turn is connected through resistor 122 to junction 123 and this in turn is connected through resistor 124 to junction 65. Junctions 61 and 123 are tied together. Junction 121 is also connected to junction 126 which in turn is connected through resistor 127 back to switch contact 74 and then junction 126 is also connected to junction 130 and from there through resistor 131 to switch contact 76. Junction 130 is connected also through resistor 135 to junction 136 which in turn is connected to output port 137 of op-amp IC1 and this same junction 136 is also connected through capacitor 139 to series resistance network consisting of resistors 140 and 141, whose junction is output point 142. The other end of resistor 141 is at com-return.

OPERATION OF SYSTEM ILLUSTRATED IN FIG. 2

In the position of the switch illustrated in FIG. 2, the entire system operates in substantially the manner disclosed in connection with FIG. 1. The single stage feedback loop for op-amp IC2 involving output port 95, capacitor 93, resistor 91, capacitor **91*a* and resistors 83, 84*a*, and 84*b* provides a multiple feedback narrow band pass action as set forth in connection with FIG. 1. The filter frequency is controlled by adjustment of variable resistors 84*a* and 84*b* while amplitude control is provided by the potentiometer control 100 in the output of op-amp IC2. Op-amp IC3 in FIG. 2 corresponds in function to amplifier IC3 in FIG. 1 and provides inversion of the signal frequency to be eliminated. Capacitors 93 and 91*a* will be similar in value, the values successively decreasing in steps from about 63 Hz to the higher octaves assuming that this is the range where feedback peaks are likely to be present and require elimination. The unit illustrated in FIG. 2 will have to be provided for each ring mode frequency to be neutralized. Insofar as capacitors 62 and 139** are concerned, these will have large values such as, for example, 100 μF.

When switch 69 is moved downward from the position shown in FIG. 2, contacts 68 and 74 are left open, but switchblade 70 joins contacts 72 and 73 and switchblade 71 joins 75 with 76. This action now forms a secondary internal loop of positive feedback from the output terminal 107 of op-amp IC3 through capacitor 115, resistor 116, resistor 80 to junction 81, and in turn is coupled through the filter network, previously identified, to input port 89 of op-amp IC2. In the explanation of FIG. 1, it was stated that the output waveform from IC3 is in phase with the acoustic feedback signal to the inverting input port of IC2.

Thus when attenuator control 100 is advanced to a point where the net coupled gain of op-amp IC2 and IC3 exceeds unity, the dual stages will go into oscillation at a frequency determined by the constants of the narrow passband filter network. The oscillation frequency is mixed into op-amp IC1 through resistor 131. Thus, when an entire sound system is being checked out and is howling at a feedback frequency, coarse control **84*a* can be varied until beats are heard in the loudspeakers between the acoustic howl frequency and the temporarily injected oscillator frequency. A suitable a.c. voltmeter or oscilloscope may be connected between junction 142 and com-return to visually observe the beats. A closer adjustment to zero-beat can be made using variable resistor 84*b***.

In essence, this zero-beat setting tunes the octave passband circuit to precisely the acoustic feedback frequency, so that when switch 69 is returned upward to the position shown in FIG. 2, attenuator control 100 can be reset to a level equalizing the overall ring-mode rejection to whatever level is desired, generally from about 5 to 15 dB. With this particular room ring frequency eliminated, then as the sound system gain is advanced upward, the next appearing howl can be eliminated by a cascaded second unit like that of FIG. 2 but covering a proper frequency range by similar procedure. The process can be continued until the sound system can operate satisfactorily, at high audio gain, free of howling or ringing. Typically, with hard-walled rooms, up to 6 or more decibels in overall sound level can be achieved by use of this invention before room feedback occurs as compared to using a sound system having merely broad equalization.

Output resistors 140 and 141 are so related in value to each other as to provide unity gain for the entire system shown in FIG. 2. This makes cascading of units practical.

An exemplary table of resistor and capacitor values follows.

Resistors In Ohms

80 — 27K
83 — 20
**84*a*** — 200
**84*b*** — 10
91 — 270K
98 — 1
**98*a*** — 10K
101 — 20K
104 — 20K
110 — 1
116 — 20K
122 — 30.1K
124 — 100K
127 — 51.5K
131 — 1 meg.
135 — 51.1K
140 — 1.82K
141 — 750

Capacitors

62 — 100 μF
115 — 10 μF
139 — 100 μF
By-pass — 0.05 μF

Capacitors 93 and **91*a*** are substantially equal in value, these values depending upon the frequency ranges to be covered.

| | (uF) |
|---|---|
| 63 - 125 Hz | .39 |
| 125 - 250 Hz | .22 |
| 250 - 500 Hz | .11 |
| 500- 1,000 Hz | .051 |
| 1,000 - 2,000 Hz | .025 |
| 2,000 - 4,000 Hz | .012 |

The performance of the new acoustic feedback elimination unit is enhanced by the fact that the two signal paths (the broadband and the narrow passband) are isolated from each other to the points when they reach their respective input ports of the common mode rejection type differential amplifier. At no prior metallic junction are the signals mixed or summed for feeding to a common impedance device. Excellent stability and critical frequency tuning can be achieved through selection of components whose values remain constant with varying environmental conditions, including aging.

What is claimed as new and desired to secure by Letters Patent is:

1. A system for cancelling an acoustic feedback frequency component from a broad-band audio frequency composite signal produced by an audio source, said system comprising active phase-inverting filter means having an input and an output and having a narrow passband including the acoustic feedback frequency, said filter means including tuning means for varying the center frequency of the passband over a range of frequencies, phase reversing means having an input coupled to the output of said filter means and an output, differential summing means having an inverting input coupled to the output of said phase reversing means and a non-inverting input for connection to the associated audio source to receive the composite signal and an output, and switching means connected to the input of said filter means and to the output of said phase reversing means and adapted to be connected to the associated audio source, said switching means having normal and feedback conditions for connecting the input of said filter means respectively to the associated audio source and to the output of said phase reversing means, said phase reversing means producing at the output thereof a feedback signal in phase with the composite signal at the input of said filter means when said switching means is in the normal condition thereof, said summing means being responsive to said feedback signal and the composite signal for subtracting one from the other thereby to cancel the acoustic feedback frequency component of the composite signal, said switching means in the feedback condition thereof effecting oscillation of said filter means and said phase reversing means to produce an oscillation signal having a frequency determined by the tuning of said filter means, said summing means being responsive to said oscillation signal and the acoustic feedback frequency component of the composite signal to produce a beat frequency therebetween, said beat frequency being zero when said filter means is tuned to the acoustic feedback frequency, whereby said system may be accurately tuned for cancellation of any acoustic feedback frequency component.

2. The system set forth in claim 1, wherein said tuning means includes coarse tuning means and fine tuning means.

3. The system set forth in claim 1, and further including attenuating means connected between the output of said filter means and the input of said phase reversing means for varying the amplitude of said feedback signal.

4. The system set forth in claim 1, wherein said filter means comprises an operational amplifier connected in a narrow bandpass, infinite gain, multiple feedback configuration.

5. The system set forth in claim 1, wherein said summing means comprises a differential amplifier having isolated input ports and connected to operate in a common mode rejection configuration.

6. The system set forth in claim 1, wherein the overall gain of said system outside said narrow passband is unity, thereby to permit cascading of a plurality of said systems for respectively eliminating a plurality of different feedback frequencies without substantially altering the amplitude of the composite signal.

* * * * *